(12) United States Patent
Glenn

(10) Patent No.: US 6,465,329 B1
(45) Date of Patent: Oct. 15, 2002

(54) MICROCIRCUIT DIE-SAWING PROTECTOR AND METHOD

(75) Inventor: Thomas P. Glenn, Gilbert, AZ (US)

(73) Assignee: Amkor Technology, Inc., Chandler, AZ (US)

( * ) Notice: Subject to any disclaimer, the term of this patent is extended or adjusted under 35 U.S.C. 154(b) by 0 days.

(21) Appl. No.: 09/233,980

(22) Filed: Jan. 20, 1999

(51) Int. Cl.[7] .................. H01L 21/46; H01L 21/78; H01L 21/301
(52) U.S. Cl. .......... 438/462; 438/460; 438/465; 438/928; 438/113; 438/114; 438/33
(58) Field of Search .............. 438/33, 113, 118, 438/460, 462, 465, 928, 114, 115, 464

(56) References Cited

U.S. PATENT DOCUMENTS

| | | | |
|---|---|---|---|
| 3,887,996 A | * 6/1975 | Hartleroad et al. | 438/111 |
| 4,229,732 A | 10/1980 | Hartstein et al. | 340/378.2 |
| 4,943,750 A | 7/1990 | Howe et al. | 310/309 |
| 5,196,378 A | * 3/1993 | Bean et al. | 438/107 |
| 5,362,681 A | 11/1994 | Roberts, Jr. et al. | 437/226 |
| 5,427,975 A | 6/1995 | Sparks et al. | 437/79 |
| 5,710,065 A | 1/1998 | Alfaro | 437/226 |
| 5,920,769 A | * 7/1999 | Ball et al. | 438/113 |
| 5,923,053 A | * 7/1999 | Jakowetz et al. | 257/95 |
| 5,981,314 A | * 11/1999 | Glenn et al. | 438/127 |
| 6,083,811 A | * 7/2000 | Riding et al. | 438/460 |

* cited by examiner

*Primary Examiner*—Carl Whitehead, Jr.
*Assistant Examiner*—Khanh B. Duong
(74) *Attorney, Agent, or Firm*—Skjerven Morrill LLP

(57) ABSTRACT

A method and apparatus for protecting hypersensitive microcircuits on the face of a semiconductor wafer from contamination and mechanical damage during die sawing and subsequent die handling operations include the provision of a plastic sheet having an array of protective domes formed into it, the array corresponding to the array of microcircuits on the wafer, and the temporary adhesion of the sheet to the face of the wafer such that each die in the wafer is covered by a respective one of the domes, with an associated one of the microcircuits protectively sealed therein. Die sawing is performed with the component side of the wafer facing up, the cut passing between the domes and through the thicknesses of both the domed sheet and the wafer such that each die is separated from the wafer, with a corresponding one other domes still attached to it. The domes may be removed later when the dies are located in a more benign environment by simply peeling them off the die. The invention enables the use of conventional die-handling equipment and results in improved device yield.

17 Claims, 3 Drawing Sheets

MICROCIRCUIT DIE-SAWING PROTECTOR AND METHOD

BACKGROUND OF THE INVENTION

1. Field of the Invention

This invention relates to microcircuit packaging in general, and in particular, to a method and apparatus for protecting hypersensitive microcircuits on a semiconductor wafer from contamination and mechanical damage during die sawing and subsequent die-handling operations.

2. Description of the Related Art

Microcircuits are typically fabricated on the surface of a wafer of a semiconductor material, e.g., silicon, in a rectangular array of identical devices. The typical manufacturing process involves numerous manufacturing steps, such as cleaning, printing, etching, doping, coating, plating, and ion implantation. Upon completion of these steps, and prior to the packaging of the individual microcircuits for use in electronic devices, the microcircuits, together with an underlying portion of the wafer, are separated from wafer into individual dies, or "chips." This separation is typically accomplished by a mechanical sawing operation, or by breaking the wafer along scribe lines created in the wafer by a laser or a diamond-tipped scribe.

In conventional microcircuit die sawing practice, a layer of a sticky tape, such as that sold by the Nitto Denko Corporation of Osaka, Japan under the name "Nitto tape," or that sold by the Lintec Company of Shiga, Japan, is attached to the backside of the wafer, which is then placed face up on the saw table, and sawn through down to, but not including, the tape backing. The individual dies are then removed from the tape by automated "pick-and-place" die-handling equipment that includes a needle that pierces the sticky tape from the underside to contact the bottom surface of the die and separate it from the tape, and an arm that grasps the upper, circuit-containing surface of the die with, e.g., a vacuum collect, and transports it to another location for subsequent processing Typical microcircuits manufactured in the above manner are substantially flat, i.e., the circuit components and elements are closely integrated with each other, are substantially planar in form, and are typically on the order of a few angstroms to a few microns thick. As such, they are moderately resistant to contamination by dust particles and vapors generated during the die-sawing operation, as well as to mechanical damage occasioned by handling of the dies during die sawing and subsequent manufacturing operations. In some instances, this resistance to contamination and/or mechanical damage can be enhanced by the vapor deposition of a protective layer of silicon dioxide or silicon nitride on the face of the microcircuits prior to die separation.

However, there are at least two classes of microcircuit devices that are highly sensitive to contamination by die-sawing byproducts and/or to mechanical damage occasioned by handling during manufacturing, namely, the so-called "optical sensor" and "micro-machine" devices. An example of the former would include the "micro-mechanical display logic and array" of A. M. Hartstein, et al., (U.S. Pat. No. 4,229,732), while examples of the latter would include the "electrostatic motor" described by R.T. Howe, et al. (U.S. Pat. No. 4,943,750), or the "machine structures" made by the method of Sparks et al. (U.S. Pat. No. 5,427,975).

These latter types of devices have in common that both types include highly fragile micro-structures and/or specialized reflective surfaces that either extend, or face, upward from the face of the die, and they may also include microscopic openings into the underlying semiconductor substrate, such as might be found in an integrated circuit pressure transducer. For obvious reasons, these structures are highly susceptible to both contamination by the dust, cooling liquids, and/or vaporous by-products generated by die-sawing, as well as to the mechanical damage that could result from, e.g., a slight, unintended gust of air or drop of water incident on the face of the wafer. Such contamination or damage could result in an entire wafer of relatively expensive devices being ruined and scrapped.

Accordingly, special manufacturing procedures and equipment are needed to handle these hypersensitive types of devices. This is particularly so at the stage of their manufacture at which the micro-features are fully defined on the face of the wafer or on the separated dies, such as during the die-sawing operation, or during subsequent die-mounting procedures. The prior art methods and apparatus for dealing with these special types of microcircuits described below, while workable, have some associated drawbacks that adversely effect their efficiency.

The prior art method for die-sawing these hypersensitive types of microcircuits is described in some detail in U.S. Pat. No. 5,362,681 to C. M. Roberts, Jr., et al. The method includes inverting the wafer face down on the saw table and sawing it from the back face of the wafer. To protect the microcircuit devices on the front face of the wafer, the wafer is attached to a spacer film, typically a Mylar tape, carried on a stretcher frame. The film has a pattern of openings in it corresponding to the array of dies on the face of the wafer, and is adhered to the front face of the wafer, rather than to its backside, as is done with conventional microcircuits. The spacer film is sized such that its periphery overhangs the margin of the wafer. Four sets of alignment holes, oriented with respect to the "streets" between the dies, are punched into the tape on opposite sides of the wafer outside of its margin. A second film is then adhered to the backside of the spacer film to seal the component openings in the spacer film.

The wafer is then placed upside-down on the saw table, and aligned with respect to the saw blade by means of an alignment system that aligns the wafer with respect to the above-described four sets of alignment holes in the spacer film. The wafer is sawed through its back side down to, but not through, the spacer film to singularize the dies from the wafer. The dies are then individually pushed and lifted from the spacer film by means of specially designed pick-and-place equipment that includes a special, hollow "needle cluster" that pushes upwardly through the spacer film to contact the edges of the die to separate it from the film, and an arm that grasps the die from the back side with a vacuum collet. The arm then inverts the die 180 degrees such that its front face faces upward, then hands the die off to a second arm also equipped with a special hollow vacuum collet that enables the arm to grasp the sensitive front side of the die without damaging the microcircuit thereon.

While the above prior art method is workable, it has several drawbacks associated with it: First, since the wafer is sawn upside down, the underside of the dies, rather than their top surfaces, are presented for removal of the dies from the spacer film. This prevents the use of conventional automated pick-and-place equipment, and necessitates the use of the specially adapted pick-and-place apparatus described above to accommodate the sensitive microstructures located on the top side of the die. It would be desirable if conventional pick-and-place die handling equipment could be used with these hypersensitive types of chips.

Also, because removing the dies from the spacer film destroys the sealed enclosure that protects the microcircuits during the sawing operation, once the dies are removed from the spacer film, they must thereafter be maintained in a clean room environment and are at increased risk of mechanical damage and/or contamination until they have been individually packaged in a protective enclosure. It would therefore be desirable if the protection afforded the delicate microstructures during the sawing operation could be retained with the individual dies after sawing so that they could be safely handled and stored in a less critical environment.

Further, because the wafer is sawn face down on the table, the scribe lines on its face, and indeed, the microcircuits themselves, are not directly accessible for saw alignment purposes. Instead, the saw must be indirectly aligned with the wafer by means of the four sets of alignment holes in the film spacer described above. Since there is a tolerance buildup between the various parts, this results in a loss of precision in the location of the saw cuts, and thus necessitates a wider spacing, or street, between devices to accommodate the tolerance buildup. In particular, the width of the scribe lines necessitated by this prior art method is 12 mils, i.e., four times as great as the conventional die spacing, or scribe line width, possible with a wafer that is sawn face up. This translates into a waste of wafer space and a concomitant reduction in device-per-wafer yield.

What is needed, then, is an effective method and apparatus for handling these types of fragile and contamination-sensitive microcircuits that overcomes the above problems in a simple, inexpensive, and efficient manner.

SUMMARY OF THE INVENTION

According to this invention, a simple, inexpensive, and efficient method and resulting structure are provided for protecting the microcircuits on the face of a semiconductor wafer from contamination and damage during wafer sawing and subsequent die attachment procedures. The method comprises forming a sealed, protective dome over each of the microcircuits on the face of the wafer such that, when the individual microcircuits and associated dies are sawn from the wafer, the protective dome over each of the microcircuits remains associated with and protectively sealed over its associated microcircuit.

In one embodiment of a saw protector, a first sheet of material is selected, preferably plastic, having an area sufficient to cover all of the microcircuits in the wafer. A pattern, or array, of protective domes corresponding to the array of microcircuits on the wafer is formed into the sheet, e.g., by molding or thermo forming. Each of the domes is formed to have a height greater than the maximum height of any etched or mechanical feature extending upward from the microcircuits, and a periphery at least as great as the periphery of its corresponding microcircuit.

The edges of the sheet are preferably trimmed such that, when the sheet overlays the wafer, the ends of conventional saw-alignment scribe lines on the face of the wafer are exposed for use by either manual or automated optical saw alignment equipment. The sheet is oriented with the dome openings facing toward the wafer, and is aligned with respect to it such that each of the domes is disposed over a corresponding microcircuit. The sheet is then impermanently adhered to the face of the wafer, preferably by means of a pressure-sensitive adhesive having a peel-off protective backing previously applied to the sheet, such that each microcircuit on the face of the wafer is individually covered by and protectively sealed within its own corresponding dome during die-sawing and subsequent die handling operations.

When the dies are thereafter separated from the wafer by sawing of the wafer, the wafer is sawn with its front side facing up, and the cut is made to pass along the scribe lines between the dome-covered dies, and to cut through both the domed sheet and the wafer so that a portion of the sheet, including the protective dome over each microcircuit, remains attached to and protectively sealed over its corresponding microcircuit and associated die.

In an alternative embodiment, the sheet is selected from a material having a thickness greater than the maximum die-feature height, and the domes are partially defined, e.g., by die-cutting, to comprise openings that extend through the entire thickness of the sheet. These through-openings facilitate alignment of the sheet with the wafer, as the desired disposition of the microcircuits within the openings may be readily visualized through the upper surface of the sheet during its alignment with the wafer using automated optical pattern recognition methods. A second sheet having a periphery conforming to the first sheet is then adhered to the top surface of the first sheet to close off the through-openings and thereby form individual, sealed protective domes over each microcircuit. As with the first embodiment, the saw cut is made from the front face, or top surface of the wafer, with the saw passing along the scribe lines between the dies and through both sheets of the saw protector, and then through the thickness of the wafer such that, when the dies are separated from the wafer, each is accompanied by its own sealed protective dome over the associated microcircuit. The die can be picked up and handled by means of the domed enclosure, which accompanies the die and protects the microcircuit on it, both during the sawing operation and subsequently, e.g., during die attachment, yet the enclosure is easily removed at a later stage by simply peeling it away from the chip.

A better understanding of the invention, along with its many attendant features and advantages, may be had from a consideration of the following detailed description of its preferred embodiments, particularly if reference is also made to the figures in the accompanying drawings. Following is a brief description of those drawings.

DETAILED DESCRIPTION OF THE PREFERRED EMBODIMENTS

Figure 1:
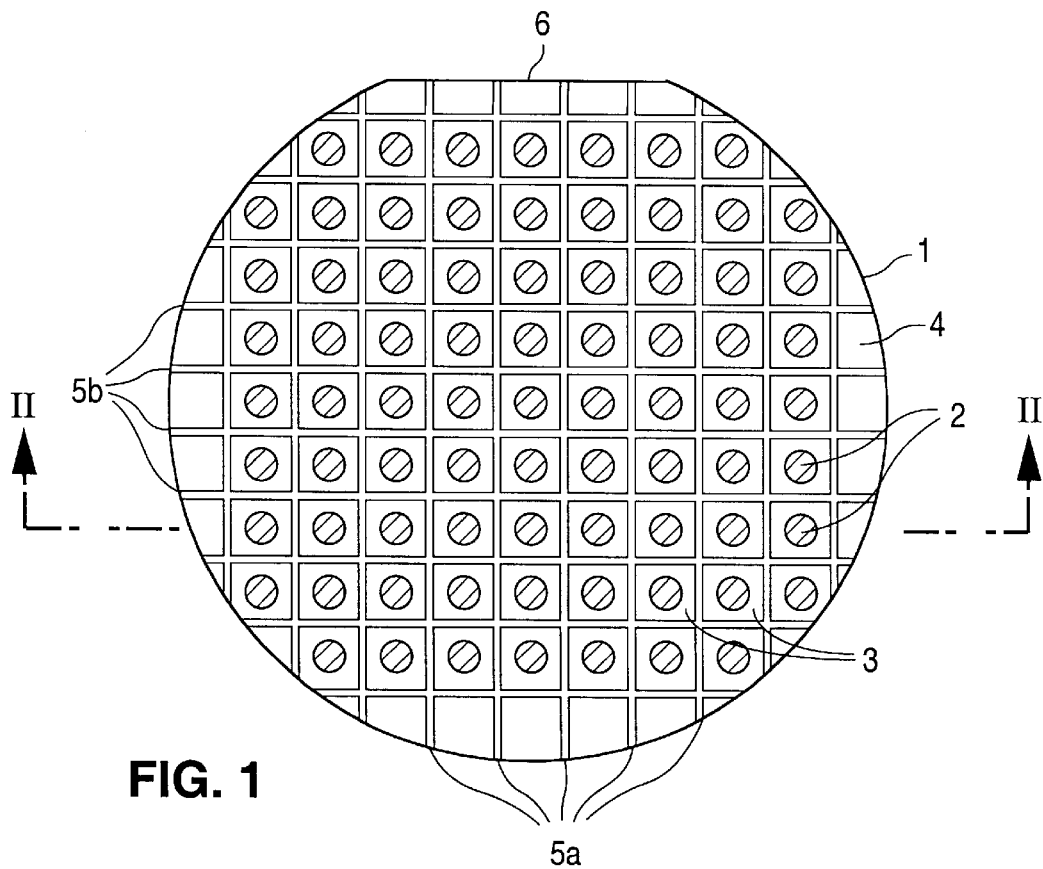
FIG. 1 is a plan view of a semiconductor wafer having an array of dies and associated microcircuit devices formed on its face.

FIG. 1 is a plan view of a conventional semiconductor wafer 1 of the type concerned with here showing a number of microcircuits 2 (shown as crosshatched circles), each formed on the top of a corresponding die 3. The dies, or "chips," are typically square in shape, and are defined in a rectangular array on the face 4 of the wafer by a plurality of lines 5a, 5b mechanically scribed on the face of the wafer. The wafers are usually round, are provided in a variety of diameters, and typically have at least one segment removed at a margin of the wafer to define a flat edge 6, called a "primary flat."

The primary flat 6 is oriented with respect to the underlying crystalline structure of the wafer 1, and the scribe lines 5a, 5b are, in turn, oriented with respect to the primary flat, to ensure that the array of dies 3 is appropriately aligned with the break pattern of the wafer. In FIG. 1, one set of parallel scribe lines 5a is shown intersecting the primary flat orthogonally, while a second set of parallel scribe lines 5b is shown parallel to the primary flat and orthogonal to the first set.

The number of microcircuits 2 that can be formed on a single wafer 1 depends on the size of the wafer and the size of the individual microcircuits, and can range from a single microcircuit per wafer, to several hundred. When fabrication of the microcircuits is complete, and prior to their incorporation into individual packages for use in electronic devices, the microcircuits must be separated from the wafer 1. While this may be accomplished by simply breaking the wafer along the scribe lines 5a, 5b, it is more typically done today by means of a mechanical sawing operation using a very thin, rotating blade coated with a diamond-abrasive to minimize silicon loss and maximize device yield. In the typical die-sawing operation, the scribe lines serve primarily as saw alignment guides, and are typically 3 mils (0.003") wide.

As discussed above, there are at least two classes of microcircuit devices that are not amenable to conventional die-separation processes because they are particularly sensitive to contamination by die-sawing byproducts and/or to mechanical damage occasioned by handling. These are the so-called "optical sensor" and "micro-machine" devices described above, which are characterized by extremely fragile micro-structures and/or critical reflective surfaces that face, or project, upward from the surface of the device, and hence, require special protection during die sawing and subsequent die handling to prevent their being damaged.

Figure 3:
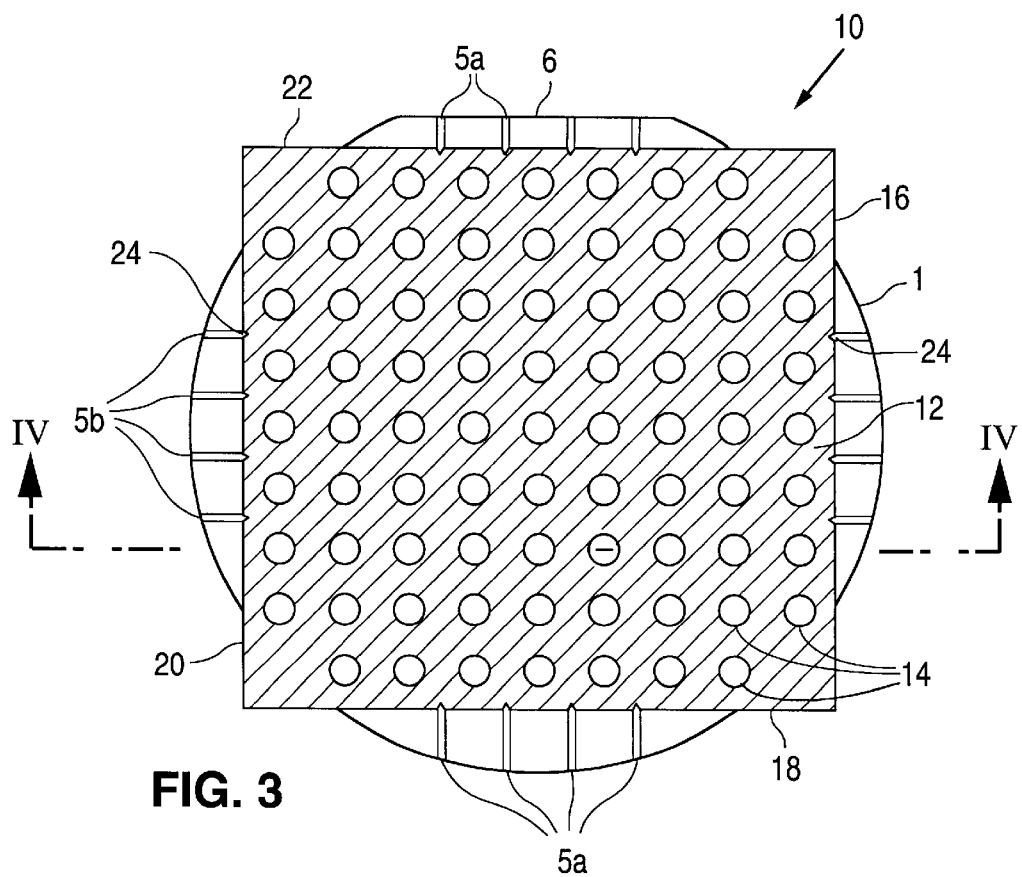
FIG. 3 is a plan view of the wafer illustrated in FIG. 1 showing a first sheet of one embodiment of a saw protector in accordance with the present invention overlying the face and dies of the wafer.
Figure 5:
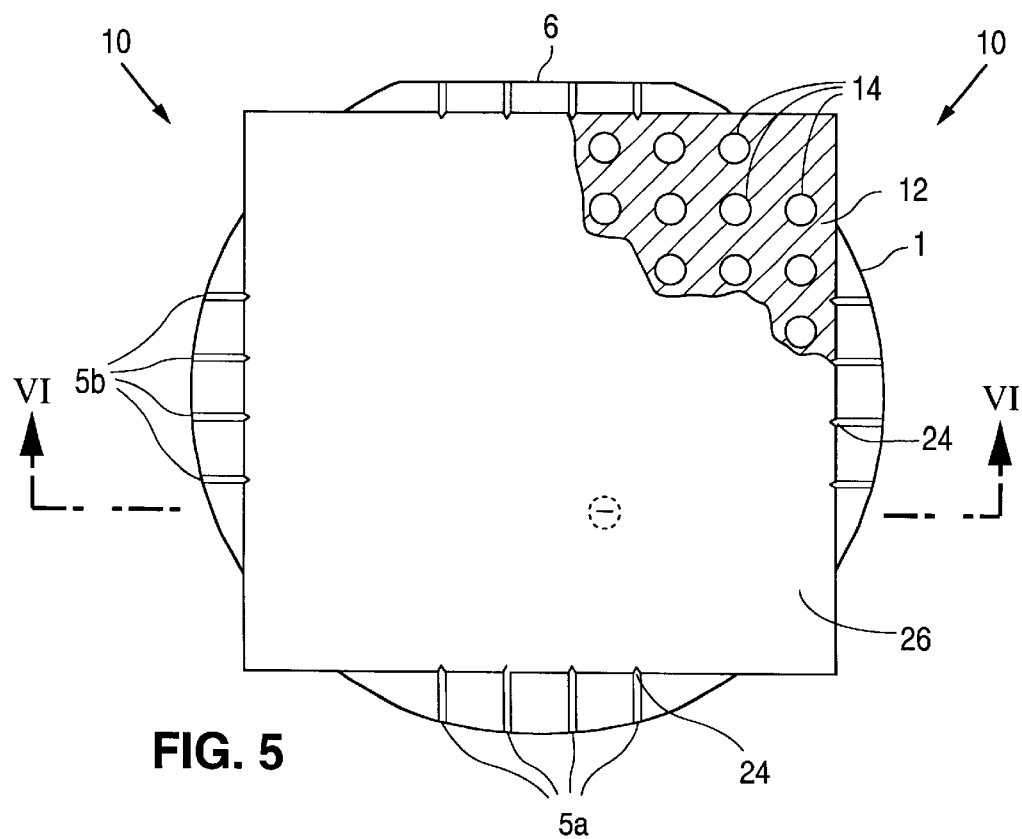
FIG. 5 is a plan view of the wafer and saw protector first sheet illustrated in FIG. 3 showing a second sheet of the saw protector overlying the first sheet and partially broken away to reveal the first sheet.

A first embodiment of a sawing protector 10 of the present invention that overcomes the problems of the prior art method of handling these more sensitive microcircuits is illustrated in plan view in FIGS. 3 and 5. As shown in FIG. 3, the protector 10 comprises a first sheet 12 of material, preferably a transparent, semi-rigid plastic, that is easy to saw, but which is not so soft that it binds or loads up the blade of the saw. The first sheet 12 has an area sufficiently large to cover all of the dies 3 in the face 4 of the wafer 12, and a thickness greater than the maximum height of any microcircuit feature extending upward from the face of the dies, such as the cantilever beam mirrors of an electrostatic light valve microcircuit. In this regard, it has been found that a material of from between about 1 to 5 mils in thickness is adequate for most purposes, and either of the conventional sticky tapes sold by Nitto Denko Corp., product name/no. "SWT-10," or the Lintec Co., product name/no. "Adwill T-5782" have been found to be acceptable for this purpose.

A pattern of openings 14 is then formed into the first sheet 12, the pattern corresponding to the array of microcircuits 2 on the face of the wafer 1. The openings are preferably round, as it has been found that this shape affords a better resistance to an undesirable deformation of the sheet caused, e.g., by sagging or pulling, than do rectangular openings. The openings 14 extend through the entire thickness of the sheet, and each has a periphery, or circumference, that is at least as great as the periphery of its corresponding microcircuit device 2.

Importantly, the first sheet 12 is trimmed such that, when the openings 14 in the sheet are aligned with the microcircuits 2 on the wafer 1, one of the ends of each of the two sets of orthogonal scribe lines 5a, 5b on the face 4 of the wafer are exposed at one of the four edges 16, 18, 20 and 22 of the sheet for saw alignment purposes.

The sheet 12 is then aligned with respect to the face of the wafer such that each of the microcircuits 2 is disposed within a corresponding through-opening 14. In the exemplary embodiment illustrated in FIG. 3, the through-openings 14 materially assist this alignment step, since the position of the microcircuits within the openings is readily visualized through the upper surface of the sheet. However, in an alternative, one-piece embodiment such as that described below, the openings 14 may be closed off at the top, and it may therefore be desirable to provide the edges 16, 18, 20 and 22 of the sheet with a number of alignment notches 24 that are keyed to the scribe lines 5a, 5b for purposes of a "blind" alignment of the sheet 12 with respect to the wafer 1.

When the first sheet 12 is appropriately aligned with the wafer I such that each of the microcircuits 2 is disposed within a corresponding one of the openings 14, the lower surface of the sheet is adhered to the face 4 of the wafer. For purposes of this adhesion, it is preferable that the lower surface of the sheet be precoated with a pressure-sensitive adhesive, one that does not adhere permanently to or leave a residue on a mounting surface when the sheet is peeled away from it. The pressure sensitive adhesive provided on the lower surface of conventional Nitto tape has been found to be satisfactory for this purpose, and more desirably, comes with a peel-away protective backing on it that keeps the adhesive clean and fresh until it is ready for use. However, it is possible to avoid the use of a conventional adhesive on the sheet altogether by using of a sheet of material comprising a partially polymerized plastic such that it is inherently sticky, or "tacky," such as the above-identified tape sold by the Lintec Company, which relies on a UV-curable layer of acrylic as an adhesive means.

As shown in FIG. 3, when the first sheet 12 is adhered in place on the wafer 1, a second sheet 26 of material having an area sufficient to cover the first sheet is selected and trimmed so that its outline conforms to the periphery of the first sheet, particularly at the trimmed edges 16, 18, 20 and 22 of the latter, so that the ends of the saw-alignment scribe lines 5a, 5b remain visible when the second sheet overlays the first. The second sheet 26 is then aligned with and adhered to the upper surface of the first sheet 12 such that each of the openings 14 is closed off at its top, thereby creating an individual, sealed protective enclosure, or dome 28, over each of the microcircuits 2 and associated dies 3. Like the first sheet 13, the second sheet 26 is preferably made of a semi-rigid plastic material, and Nitto tape or a similar material, with a thickness of from about 1 to 5 mils, and a sticky surface, such as a previously applied coating of a pressure-sensitive adhesive, has been found to be a satisfactory material for this component of the saw protector 10.

As seen in the plan view of FIG. 5, the wafer 1 and its array of individually sealed and protected microcircuits 2 are now ready for die-sawing. Optionally, a layer of conventional sawing tape 34 (see FIG. 7) may be applied to the backside of the wafer, as described above in connection with conventional microcircuit die sawing, to hold the chips together in a matrix after the dies are sawn from the wafer. As with conventional, non-sensitive microcircuits, sawing is then accomplished with the top, or circuit surface, of the wafer face up on the saw table, using the visible ends of the scribe lines 5a, 5b for saw alignment, thereby enabling the same degree of sawing precision, and hence, device yields, heretofore achievable only with conventional microcircuit chips. The saw cut is made through the top surface of the wafer, with the blade passing along the transverse scribe lines 5a, 5b between the dies 3, to cut through the thicknesses of the first and second sheets 12 and 26 of the saw protector 10, and thence, through the face of the wafer 1 such that, when the individual microcircuits 2 and associated dies 3 are separated from the wafer, a portion 30 of the protector, including the protective dome 28 covering each of the dies, remains associated with and protectively sealed over its corresponding microcircuit and die, as progressively illustrated in FIGS. 2, 4, 6 and 7.

Figure 2:
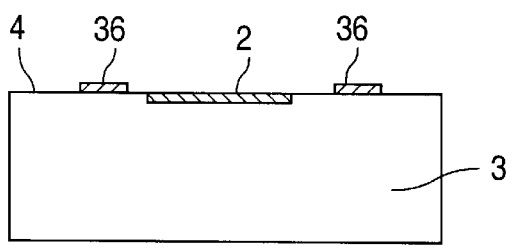
FIG. 2 is a cross-sectional view through one of the dies and associated micro-circuits of the wafer shown in FIG. 1, as revealed by the cross section taken along the lines II—II therein.
Figure 4:
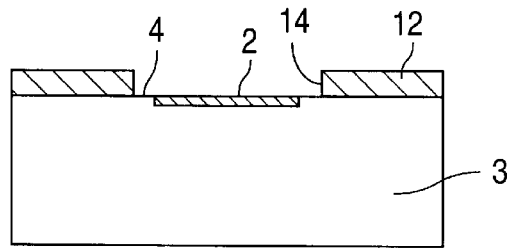
FIG. 4 is a cross-sectional view through one of the dies and associated microcircuits of the wafer shown in FIG. 3, as revealed by the cross section taken along the lines IV—IV therein, showing a portion of the first sheet of the saw protector overlying the face of the die.
Figure 6:
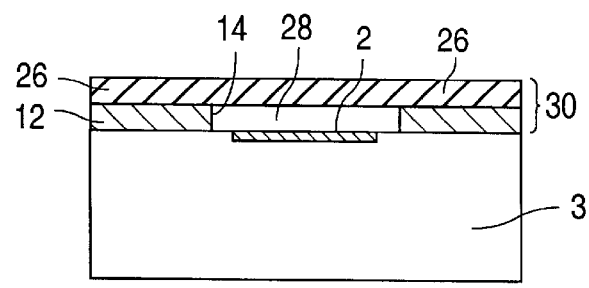
FIG. 6 is a cross-sectional view through one of the dies and associated microcircuits of the wafer shown in FIG. 5, as revealed by the cross section taken along the lines VI—VI therein, showing a portion of the first and second sheets of the saw protector overlying the face of the die and forming a protective dome over the associated microcircuit thereon.

In FIG. 2, an individual microcircuit 2, a pair of adjacent wire bond pads 36, and their associated die 3 are shown separated from the parent wafer without a sawing protector 10 of the present invention in place on the die to protect the microcircuit. In FIG. 4 the same die 3 is shown with a portion of the first sheet 12 of the saw protector in place, the microcircuit 2 being disposed within the through-opening 14 in the sheet 12. FIG. 6 shows the same chip 3 with portions of both the first and second sheets 12 and 26 in place on the chip, and thus defining a sealed, protective dome 28 over the microcircuit 2 on the face 4 of the die 3.

Figure 7:
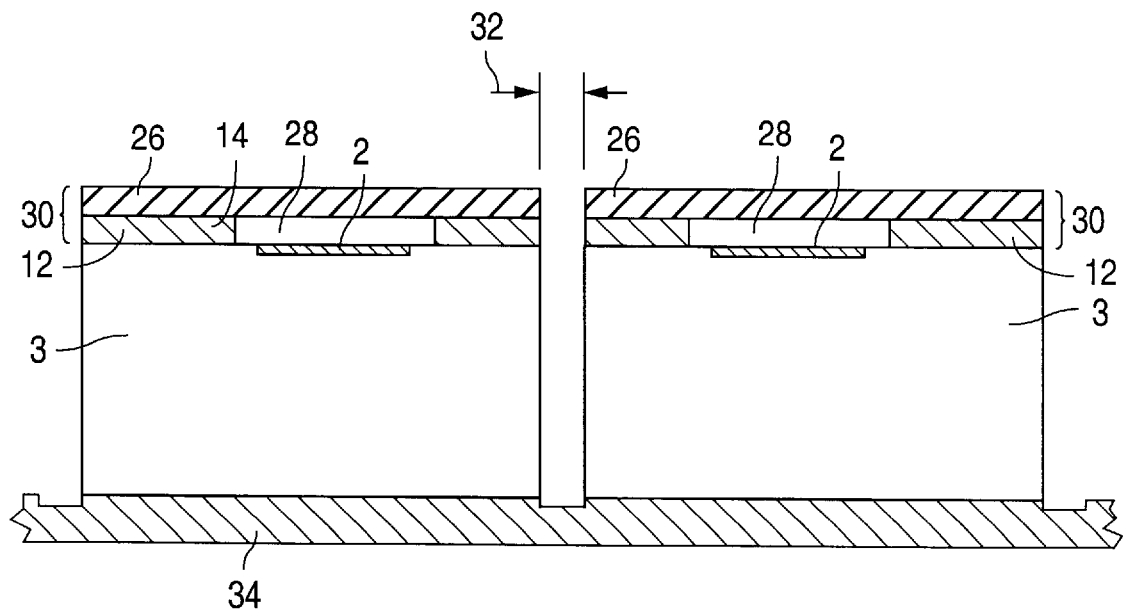
FIG. 7 is an elevational cross-section through a pair of adjacent dies of the wafer and saw protector of FIG. 5 showing a saw kerf separating the dies and a dome portion of the saw protector of the present invention overlying the face and associated microcircuit of each die.

FIG. 7 shows a pair of adjacent dies 3 attached at their bottom surfaces to a layer of conventional sawing tape 34, each microcircuit 2 having its own, individual protective dome 28, as sawn from the parent wafer and separated by the width of the saw kerf 32. Since the kerf does not extend though the bottom layer of conventional sawing tape 34, the latter tape remains intact, and serves to hold the dies 3 together in their relative positions after die sawing for handling convenience.

Figure 8:
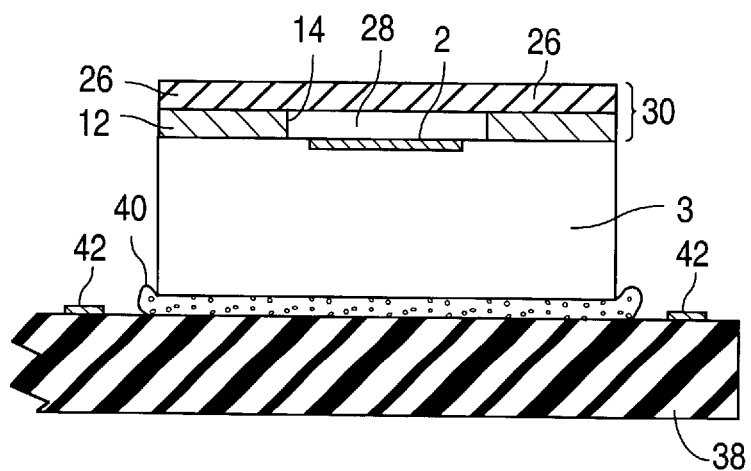
FIG. 8 is an elevational cross section through one of the dies and an associated saw protector protective dome of the present invention, showing the die mounted to a substrate of a microcircuit package, with the protective dome still in place.

It may be seen that the dies 3 are thus amenable to handling by conventional pick-and-place die-handling equipment. In particular, the dies 3 are presented right-side-up, and can be safely picked up by grasping the upper surface of the dome 28 without contacting the die 3 itself. A conventional tape-separation needle can pierce the underside of the tape layer 8 to contact the underside of an individual die 3 and separate it from the tape 34 without fear of damaging the sensitive microcircuit 2 on the top surface of the die. Further, the die 3 can be lifted off the tape 34 through the agency of the protective dome 28 using a conventional vacuum collet on a conventional pick-and-place arm, again without concern for damaging the underlying sensitive microcircuit 2. Hence, the need for a second arm, with a special collet on it for grasping the sensitive upper surface 4 of the die 3 is eliminated, as is the need to invert the die before attaching it to a substrate 38, such as illustrated in FIG. 8.

The individual protective domes 28 may thus be left in place on the dies 3 after sawing to continue protecting the underlying microcircuit 2 until such time as direct access is needed to the microcircuit itself, such as at wire bonding to the die. Interim processing steps, such as die attachment, can be carried out with the protective dome in place, which means that the die may be removed from a clean room environment for die attachment and still be protected from contamination and mechanical damage during such time. This is illustrated in FIG. 8, showing a die 3 attached to a semiconductor package substrate 38, by means of, e.g., a layer of adhesive 40. The substrate 38 may comprise, e.g., a lead frame or a printed circuit board, which typically would include a plurality of wire bond pads 42 on the substrate adjacent to the die 3. The protective dome 28 may be left in place over the microcircuit 2 during die attachment and until such time as direct access to the top surface 4 of the die is required, e.g., at the wire bonding stage.

Those skilled in the art will recognize that a simplified embodiment of the saw protector 10 can be achieved by eliminating the second sheet 26 and forming, e.g., by molding or thermo-forming, the pattern of closed protective domes 28 directly into the first sheet 12 through its lower surface. In this alternative embodiment, the thickness of the sheet 12 can in fact be less than the maximum height of any microcircuit feature extending upward from the face 4 of the dies 3, provided that the domes 28 have an internal height that is greater than such maximum die-feature height, and, as in the case of the first embodiment, a periphery that is at least as great as the periphery of its underlying microcircuit 2. The advantage of this embodiment is that it eliminates the need for the second sheet 26 and the steps of trimming it and adhering it to the upper surface of the first sheet 12. Its disadvantage, relative to the first-described embodiment, is that, unless the sheet 12 is selected of a very transparent or translucent material, the microcircuits 2 can no longer be visualized through the openings 14 during alignment of the sheet 12 with the wafer, and accordingly, some provision, such as the alignment notches 24 described above, must be made to compensate for that.

Indeed, those skilled in the art will by now recognize that, depending on the particular problem at hand, other advantageous modifications and substitutions can be made to the method and apparatus of the present invention in terms of its materials, methods and practice, without departing from its scope. Accordingly, the particular embodiments described and illustrated herein should be understood as being exemplary in nature, and not as limitations of that scope, which is defined by the claims appended hereafter.

What is claimed is:

1. A method for protecting an array of sensitive microcircuits on the front face of a semiconductor wager from contamination during sawing, comprising:

forming a sealed, protective dome over each of the microcircuits on the front face of the wafer without contacting any portion of the respective microcircuits, wherein forming a sealed, protective dome over each of the microcircuits comprises selecting a first sheet having upper and lower surfaces and an area sufficient to cover all of the microcircuits on the wafer, forming a pattern of productive domes into the first sheet through the lower surface thereof, the pattern corresponding to the array of microcircuits on the wafer, each of the domes having a height greater than the maximum height of any microcircuit feature extending upward from the face of the wafer, and a periphery at least as great as the periphery of a corresponding one of the microcircuits, and adhering the lower surface of the first sheet to the face of the wafer such that each microcircuit on the wafer is individually covered by and protectively sealed within a corresponding one of the protective domes;

trimming at least one edge of the first sheet such that, when the first sheet is adhered to the wafer, at least one end of at least one set of saw-alignment scribe line on the face of the wafer is exposed at that edge of the first sheet; and sawing through the wafer and between the domes from the front face of the wafer to singulate the microcircuits, while leaving, the protective dome over each microcircuit.

2. The method of claim 1, further comprising applying an adhesive to the lower surface of the first sheet.

3. The method of claim 1, wherein trimming the at least one edge of the first sheet further comprises forming notches in the at least one edge that are aligned with corresponding ones of the scribe lines on the front face of the wafer when respective ones of the microcircuits on the wafer are disposed below corresponding ones of the protective domes in the first sheet.

4. The method of claim 1, further comprising:
grasping an upper surface of a protective dome; and,
picking the dome up with an associated one of the microcircuits adhered thereto.

5. The method of claim 1, wherein The first sheet is transparent.

6. The method of claim 1, wherein selecting the first sheet further comprises selecting a sheet with a thickness greater than the maximum height of any microcircuit feature extending upward from the face of the wafer, and forming the protective domes further comprises forming openings through the thickness of the first sheet, and further comprising:

selecting a second sheet of material having an area sufficient to cover the first sheet;
conforming the periphery of the second sheet to the periphery of the first sheet; and,
adhering the second sheet to the first sheet such that each of the openings is closed off, with a corresponding one of the microcircuits being protectively sealed therein.

7. The method of claim 6, wherein the openings are circular in shape.

8. The method of claim 6, wherein at least one of the first and second sheets is selected from materials having a pressure-sensitive adhesive with a peel-away backing on their lower surfaces.

9. The method of claim 6, wherein at least one of the first and second sheets is Nitto tape.

10. The method of claim 6, further comprising:
grasping an upper surface of a protective dome; and,
picking the dome up with an associated one of the microcircuits adhered thereto.

11. The method of claim 6, wherein each of the first and second sheets is transparent.

12. The method of claim 6, further comprising adhering a back face of the wafer to a third sheet, and wherein sawing though the wafer comprises sawing through the first sheet, the second sheet and the wafer down to but not through the third sheet.

13. The method of claim 12, wherein the third sheet comprises a wafer-sawing tape.

14. The method of claim 12, further comprising:
piercing the third sheet with a needle to contact a back side of a microcircuit with the needle; and,
pushing the microcircuit away from the third sheet with the needle.

15. A method of singulating a plurality of dies from a semiconductor wafer, the method comprising:
providing a semiconductor wafer having an array of dies integral therein, the dies being delineated by two orthogonal sets of sawing lines defined on a front face of the wafer;
forming a protective dome over a central portion of each die in the wafer, each dome having a periphery sealed to the front face of the wafer around a periphery of an associated one of the dies therein and a central region not contacting the front face of the die, while exposing at least a portion of the sawing lines on the front face of the wafer; and,
sawing between the domes and through the wafer from the front face thereof using the sawing lines as guides to singulate the dies from the wafer, with each die having an associated one of the protective domes sealed thereon.

16. In a semiconductor wafer having a front face with guide lines delineating an array of fragile microcircuits thereon, a method for singulating the microcircuits from the wafer without damaging them, the method comprising:
providing a sheet having a first surface;
forming an array of protective domes in the sheet through the first surface thereof, the array of domes corresponding to the array of microcircuits on the front face of the wafer;
adhering the first surface of the sheet to the front face of the wafer without contacting any of the microcircuits with the sheet, and with respective ones of the microcircuits being protectively sealed under corresponding ones of the domes;
forming means in the sheet for exposing at least a portion of each of the guide lines on the wafer; and,
cutting through the sheet and the wafer from the front face thereof using the exposed guide lines as cutting guides to singulate the microcircuits from the wafer, and with corresponding ones of the protective domes remaining protectively sealed over respective ones of the microcircuits after singulation thereof.

17. A method of singulating a plurality of semiconductor dies comprising:
providing a semiconductor wafer having an array of the semiconductor dies therein, wherein each semiconductor die includes a central portion having a microcircuit at a front face of the wafer, and the semiconductor dies of the wafer are delineated by two sets of orthogonal sawing lines on the front face of the wafer;
step for sealing a peripheral portion of each of the dies of the wafer around the respective central portion and enclosing the microcircuit thereof without contacting the microcircuit;
step for exposing at least some of said sawing lines; and then sawing through the wafer from the front face of the wafer along the sawing lines whle the respective dies are sealed and the microcircuits are enclosed so as to signulate the semiconductor dies.

* * * * *

UNITED STATES PATENT AND TRADEMARK OFFICE
CERTIFICATE OF CORRECTION

PATENT NO.   : 6,465,329 B1
DATED        : October 15, 2002
INVENTOR(S)  : Thomas P. Glenn It is certified that error appears in the above-identified patent and that said Letters Patent is hereby corrected as shown below:

Column 8,
Line 61, delete "wager" and insert -- wafer --;

Column 9,
Line 3, delete "productive" and insert -- protective --;
Line 17, delete "line" and insert -- lines --; and Column 11,
Line 1, delete "whle" and insert -- while --.

Signed and Sealed this

First Day of April, 2003

JAMES E. ROGAN
*Director of the United States Patent and Trademark Office*